(12) United States Patent
Rui et al.

(10) Patent No.: US 8,317,546 B2
(45) Date of Patent: Nov. 27, 2012

(54) PRINTED CIRCUIT BOARD

(75) Inventors: Yi Rui, Shenzhen (CN); Li Fan, Shenzhen (CN); Mei Huang, Shenzhen (CN); Liang Guo, Shenzhen (CN); Jian Luo, Shenzhen (CN); Hong-Lian Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 399 days.

(21) Appl. No.: 12/818,111

(22) Filed: Jun. 17, 2010

(65) Prior Publication Data
US 2011/0290534 A1    Dec. 1, 2011

(30) Foreign Application Priority Data
May 31, 2010    (CN) .......................... 2010 1 0187287

(51) Int. Cl.
*H01R 13/64* (2006.01)

(52) U.S. Cl. ......................................... 439/680; 439/679
(58) Field of Classification Search ........... 439/678–681
See application file for complete search history.

(56) References Cited

U.S. PATENT DOCUMENTS

| 7,354,314 | B1 * | 4/2008 | Sprouse et al. | 439/660 |
|---|---|---|---|---|
| 7,357,646 | B1 * | 4/2008 | Chen | 439/70 |
| 2008/0165291 | A1 * | 7/2008 | Choi | 348/739 |

* cited by examiner

*Primary Examiner* — Jeremy Norris
(74) *Attorney, Agent, or Firm* — Altis Law Group, Inc.

(57) ABSTRACT

A printed circuit board includes a mounting area. The mounting area includes a first mounting portion and a second mounting portion. The first and second mounting portions partially overlap. The first mounting portion includes a number of first holes, a number of second holes, and a third hole. The first holes, the second holes, and the third hole are configured for the mounting of signal pins of a universal serial bus (USB) pin. The second mounting portion includes the first holes and a number of fixing holes. The first holes are configured for the mounting of signal pins of a USB connector. The fixing holes are configured for the mounting of fixing pins of the USB connector.

4 Claims, 3 Drawing Sheets

PRINTED CIRCUIT BOARD

BACKGROUND

1. Technical Field

The present disclosure relates to printed circuit boards, especially to a printed circuit board capable of securing two different types of electronic elements.

2. Description of Related Art

There are a lot of electronic elements, such as universal serial bus (USB) pins and USB connectors, mounted on a printed circuit board (PCB). Generally, the PCB defines a lot of mounting areas. Each mounting area includes several signal holes and several securing holes for securing an electronic element. However, one mounting area can normally secure only one type of electronic element.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings is illustrated by way of examples and not by limitation. It should be noted that references to "an" or "one" embodiment in this disclosure are not necessarily to the same embodiment, and such references mean at least one.

Figure 1:
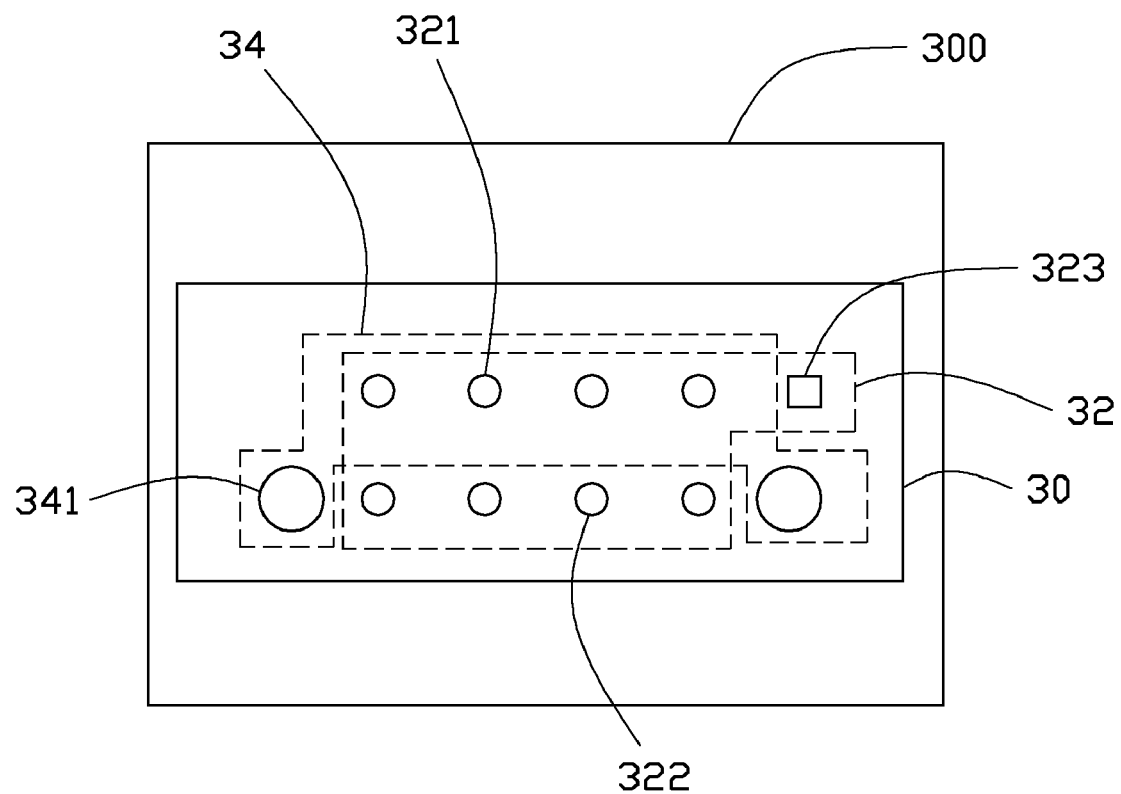
FIG. 1 is a schematic view of an exemplary embodiment of a printed circuit board.

Referring to FIG. 1, an exemplary embodiment of a printed circuit board (PCB) 300 includes a mounting area 30. The mounting area 30 includes a first mounting portion 32 and a second mounting portion 34. The first mounting portion 32 and the second mounting portion 34 partially overlap. The first mounting portion 32 includes four round first signal holes 321, four round second signal holes 322, and a square third signal hole 323. The first signal holes 321 and the second signal holes 322 are arranged in two rows. The third signal hole 323 is arranged at the end of the same row as the first signal holes 321. The first mounting portion 32 is configured for mounting a universal serial bus (USB) pin. The second mounting portion 34 includes the four first signal holes 321 and two round fixing holes 341. The fixing holes 341 and the second signal holes 322 are arranged in a row. The fixing holes 341 are arranged at opposite ends of the second signal holes 322, and adjacent to two opposite edges of the mounting area 30. The second mounting portion 34 is configured for the mounting of a universal serial bus (USB) connector. In other embodiments, the number and arrangement of the first signal holes 321, the second signal holes 322, and the third signal hole 323 can be designed according to an electronic element, which is mounted to the PCB 300.

Figure 2:
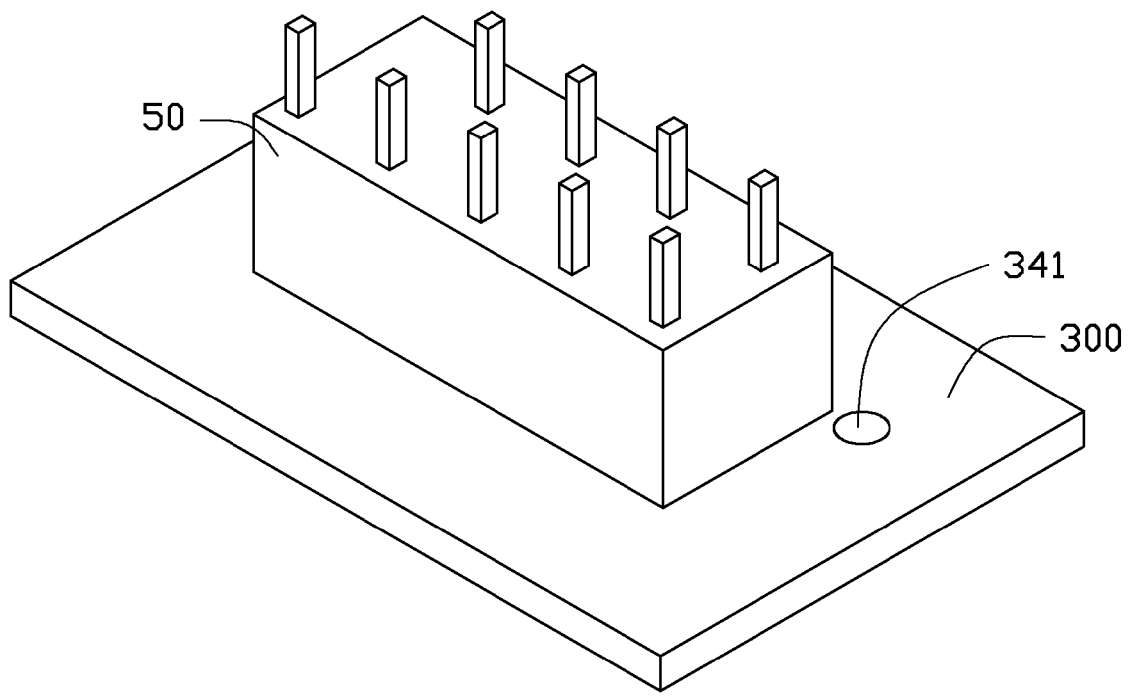
FIG. 2 is a schematic, isometric view of a universal serial bus (USB) pin mounted on the printed circuit board of FIG. 1.

Referring to FIG. 2, a printed circuit board assembly may include an assembly of the PCB 300 and a USB pin 50. The USB pin 50 includes a plurality of signal pins corresponding to the first to third signal holes 321, 322, and 323 of the PCB 300. The signal pins of the USB pin 50 can be soldered in the corresponding first to third signal holes 321, 322, and 323 of the PCB 300. The USB pin 50 can be connected to a USB device via a USB cable.

Figure 3:
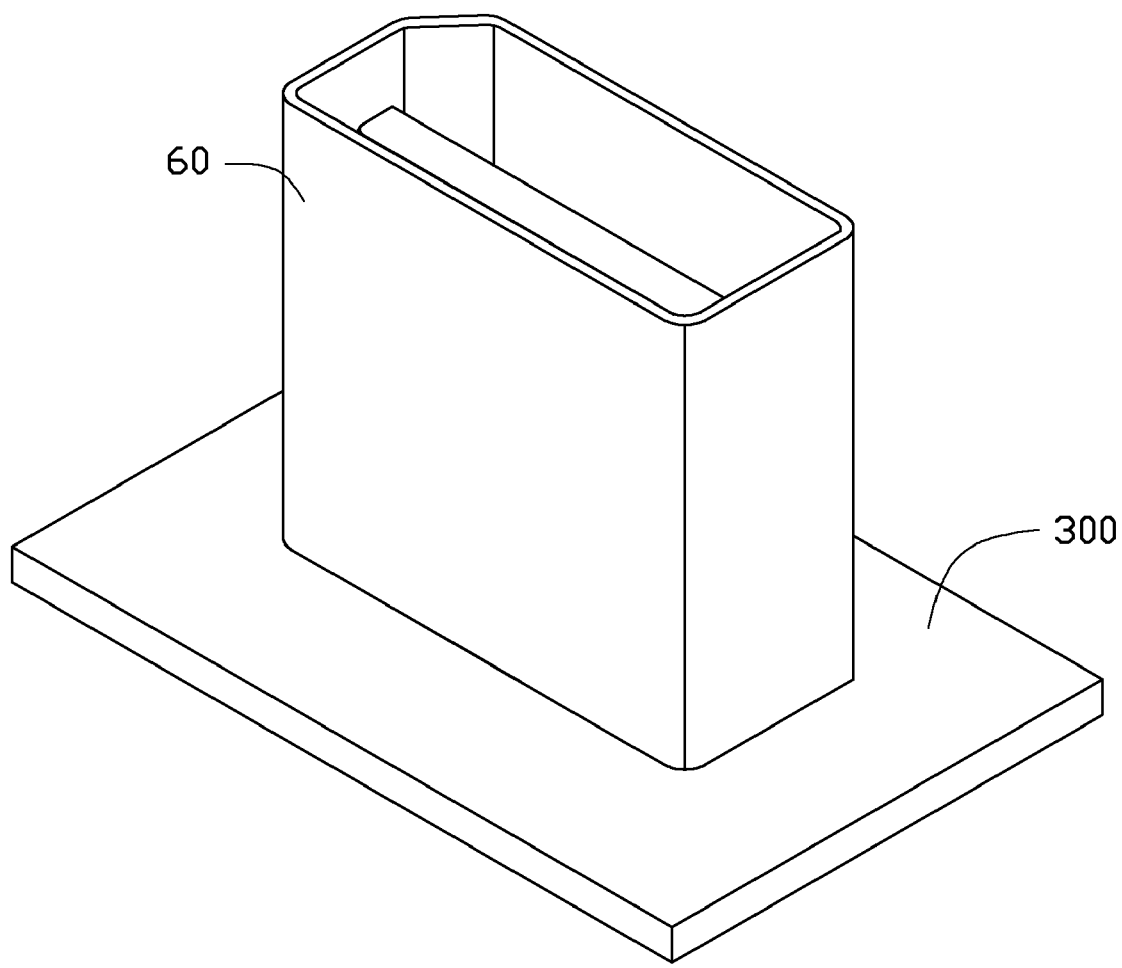
FIG. 3 is a schematic, isometric view of a universal serial bus (USB) connector mounted on the printed circuit board of FIG. 1.

Referring to FIG. 3, a printed circuit board assembly may include an assembly of the PCB 300 and a USB connector 60. The USB connector 60 includes a plurality of signal pins corresponding to the first signal holes 321 of the PCB 300, and two fixing pins corresponding to the fixing holes 341 of the PCB 300. In one embodiment, the signal pins of the USB connector 60 are capable of being soldered in the first signal holes 321 of the PCB 300. The fixing pins of the USB connector 60 can be soldered in the fixing holes 341 of the PCB 300. The USB connector 60 can be connected to a USB device.

The USB pin 50 or the USB connector 60 can be selectively mounted to the mounting area 30 of the PCB 300.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board (PCB) comprising:
   a mounting area comprising:
      a first mounting portion comprising a plurality of first holes, a plurality of second holes, and at least one third hole, wherein the first holes, the second holes, and the third hole are operable to mount signal pins of a universal serial bus (USB) pin; and
      a second mounting portion partially overlap with the first mounting portion, the second mounting portion comprising the plurality of first holes and a plurality of fixing holes, wherein the first holes are operable to mount signal pins of a USB connector, the fixing holes are operable to mount fixing pins of the USB connector.

2. The PCB of claim 1, wherein the number of the first signal holes is four, and each of the first signal holes is round; the number of the second signal holes is four, and each of the second signal holes is round; the number of the at least one third signal hole is one, and the third signal hole is square; the number of the fixing holes is two, and each of the fixing holes is round.

3. The PCB of claim 2, wherein the four first signal holes and the four second signal holes are arranged in two rows, the third signal hole is arranged at the end of the same row as the first signal holes.

4. The PCB of claim 3, wherein the two fixing holes and the four second signal holes are arranged in a same row, and the two fixing holes are arranged at opposite ends of the second signal holes.

* * * * *